US007556122B2

(12) United States Patent
Moore

(10) Patent No.: US 7,556,122 B2
(45) Date of Patent: Jul. 7, 2009

(54) UPWARD-EXHAUSTING CORNER HORN ENCLOSURE

(76) Inventor: Dana A. Moore, 25 - 157 Th Pl. SE, Bothell, WA (US) 98012

( * ) Notice: Subject to any disclaimer, the term of this patent is extended or adjusted under 35 U.S.C. 154(b) by 259 days.

(21) Appl. No.: 11/588,999

(22) Filed: Oct. 27, 2006

(65) Prior Publication Data

US 2008/0099273 A1 May 1, 2008

(51) Int. Cl.
*H05K 5/00* (2006.01)

(52) U.S. Cl. ....................... 181/156; 181/148; 181/152; 181/198; 181/199

(58) Field of Classification Search ................. 181/148, 181/152, 156, 198, 199
See application file for complete search history.

(56) References Cited

U.S. PATENT DOCUMENTS

| | | | | | |
|---|---|---|---|---|---|
| 1,477,554 | A | * | 12/1923 | Grissinger | 181/192 |
| 2,310,243 | A | * | 2/1943 | Klipsch | 181/152 |
| 2,815,086 | A | * | 12/1957 | Hartsfield | 428/102 |
| 2,825,419 | A | * | 3/1958 | Stephens, Jr. | 181/151 |
| 2,904,123 | A | * | 9/1959 | Nigro | 181/145 |
| 2,975,852 | A | * | 3/1961 | Chave | 381/342 |
| 2,994,399 | A | * | 8/1961 | Zimmerman et al. | 181/152 |
| 3,032,137 | A | * | 5/1962 | Rice | 181/199 |
| 3,203,502 | A | * | 8/1965 | Rife | 181/156 |
| 3,666,041 | A | * | 5/1972 | Engelhardt | 181/145 |
| 3,923,124 | A | * | 12/1975 | Hancock | 181/156 |
| 4,173,266 | A | * | 11/1979 | Pizer et al. | 181/156 |
| 4,213,008 | A | * | 7/1980 | Helffrich | 381/89 |
| 4,215,761 | A | * | 8/1980 | Andrews | 181/152 |
| 4,235,301 | A | * | 11/1980 | Mitchell | 181/148 |
| 4,593,784 | A | * | 6/1986 | Flanders | 181/144 |
| 4,790,408 | A | * | 12/1988 | Adair | 181/152 |
| 4,984,653 | A | * | 1/1991 | Spors | 181/148 |
| 5,099,948 | A | * | 3/1992 | Melhart | 181/152 |
| 5,105,905 | A | * | 4/1992 | Rice | 181/155 |
| 5,187,333 | A | * | 2/1993 | Adair | 181/152 |
| 5,373,564 | A | * | 12/1994 | Spear et al. | 381/352 |
| 5,821,471 | A | * | 10/1998 | McCuller | 181/156 |
| 5,844,176 | A | * | 12/1998 | Clark | 181/148 |
| 6,356,643 | B2 | * | 3/2002 | Yamagishi et al. | 381/349 |
| 6,411,720 | B1 | * | 6/2002 | Pritchard | 381/348 |
| 6,411,721 | B1 | * | 6/2002 | Spindler | 381/349 |
| 6,425,456 | B1 | * | 7/2002 | George | 181/199 |
| 7,233,677 | B2 | * | 6/2007 | Moore | 381/341 |
| 7,252,176 | B2 | * | 8/2007 | Moore | 181/199 |
| 2004/0238268 | A1 | * | 12/2004 | Danley et al. | 181/199 |
| 2006/0231328 | A1 | * | 10/2006 | Moore | 181/199 |
| 2008/0110692 | A1 | * | 5/2008 | Moore | 181/156 |

FOREIGN PATENT DOCUMENTS

| | | | | |
|---|---|---|---|---|
| DE | 3600968 | A1 | * | 4/1987 |

* cited by examiner

*Primary Examiner*—Jeffrey Donels
*Assistant Examiner*—Forrest M Phillips

(57) ABSTRACT

A low frequency exponential bass horn enclosure suitable for use in a front-loaded or rear-loaded configuration, intended for corner placement, with driver access from the back. The unitary horn pathway exhausts upward along the dihedral axis formed by the vertical walls of the corner and the ungular form of the triangle-based enclosure.

13 Claims, 4 Drawing Sheets

UPWARD-EXHAUSTING CORNER HORN ENCLOSURE

BACKGROUND OF THE INVENTION

The present invention relates to loudspeaker enclosures of the low frequency exponential folded horn type intended for corner placement. In particular, the present invention features a unitary horn pathway and exhausts upward into the trihedron formed by two walls and a ceiling, and uses the right-angle vertical walls as the terminal section channel boundaries of the horn, producing an effective extension of the horn expansion beyond the confines of the physical enclosure.

There are several prior art examples of low frequency folded corner horn enclosures which use the planar surfaces of walls and either the conjoined floor or ceiling to complete the horn pathway. For example, U.S. Pat. No. 2,373,692 to Klipsch and U.S. Pat. No. 2,815,086 to Hartsfield, both of which teach a bifurcation of the horn pathway which in turn exhausts on both outer sides of a central planar baffle, relying on the proximity of the corner walls to maintain a waveform boundary until at such distance traveled, the appropriate mouth size is achieved beyond the limits of the physical enclosure. Exhausting the horn horizontally along the side-walls of a corner imposes the requirement of having no obstructions along both corner walls and floor at least in the distances required in order to achieve an appropriate mouth size and propagate the low frequency waveform with the least distortion. The imposed requirements on the listening space can be seen to increase the effective footprint size of the prior art horn devices mentioned previously.

The U.S. Pat. No. 2,754,926 to Rice teaches the benefits of exhausting upwards into the corner from a back-loaded horn device. The Rice invention exhausts the terminal horn section vertically using the dihedral walls as external channel boundaries after the waveform leaves the physical confines of the enclosure exit channels.

It can be seen that the most important benefit of an upward exhausting corner horn is that the requirement for side walls proximate to the corner to be free of obstructions is entirely removed, and that a device using the principle of exhausting from the top makes no further requirements on the listening space other than having corners for proper placement and the actual footprint of the device on the available floor space.

In the Home Theatre (HT) marketplace, especially, it may be specifically desirable to have obstructions along both the side walls and front wall of a dedicated listening space, such as large screen televisions, equipment cabinetry, furniture, and the like. The HT market is also most likely to find large enclosures appealing for the sonic performance they tend to produce, further enhanced by the likelihood that ample floor space may be available for them in a dedicated HT environment. In such a space, the probable position for front mains speakers would likely be in the front corners.

The formulas for calculating the values of exponential horns are well known in the art. Such examples can be found in the text "How to Build Speaker Enclosures", by Alexis Badmaieff and Don Davis, Howard W. Sams and Company, Indianapolis, Ind., 13th printing (1978) pages 86 through 91. The formulas regarding the interrelationship of horn and driver are defined by D. B. Keele, Jr., "Low Frequency Horn Design Using Theile/Small Driver Parameters", AES Preprint #1250, 1977.

The use of multiple flare rates are described by H. Olson in "Acoustic Engineering", D. Van Nostrand, Inc., 1957, and Klipsch and Delgado, "A Revised Low-Frequency Horn of Small Dimensions", AES Vol. 48, No. 10, October 2000.

Optimum mouth size is calculated using D. B. Keele, Jr., "Optimum Horn Mouth Size", AES Preprint No. 933, September, 1973.

A loudspeaker enclosure capable of reproducing the low frequency dynamic range available with current digital technology, with low distortion, employing a relatively small corner footprint, and which does not make many demands on decor or on room proportions would seem to be highly desirable.

SUMMARY OF THE INVENTION

It is an object of the present invention to provide a horn enclosure which allows for configuration as a front-loaded or rear-loaded operation. It is a further object to provide substantially the same performance as in the previously cited bifurcated horn examples but in a smaller footprint. An additional object of the invention is to reduce any requirements of space to the sides or front of the invention when placed in a corner. It is a still further object of the present invention to provide a reduction of weight and therefore cost compared to the previously cited examples of bifurcated horns. Another object, in the preferred front-loaded embodiment, is to preserve waveform phase integrity as much as possible by reducing the number and severity of folds in the horn pathway as compared to the previously cited bifurcated horn examples.

The current invention departs from the previously cited examples of corner horns in that it maintains a unitary horn pathway for its entire length. In the front-loaded embodiments, it incorporates 3 different exponential expansion rates. The current invention uses the dihedral walls of the corner it is placed in as part of the vertical horn exit channel. The exit (or terminal) horn channel is triangular in cross-section, and the expansion in that channel is in one direction only, providing a waveform boundary on 2 equal sides for the length of travel from very near the floor to the ceiling.

The present invention has the design goal of a low frequency cutoff (Fc) of 35 Hz. It can be calculated that the minimum travel length required along the walls in the upward direction in order to achieve an optimum mouth size for the 35 Hz nominal Fc in ⅛th space (approx. 1300 square inches) is approximately 5.5 feet beyond the top of the invention cabinet, that is, the minimum ceiling height for optimum performance at 35 Hz would be approximately 8.5 feet, assuming linear propagation. The waveform travel along the unbounded corner walls is not expected to behave in an entirely linear fashion due to diffraction and viscosity effects. However, it can clearly be seen in prior art that the principle of using environmental planar elements as the channel boundaries of an expanding air column on (at least) two perpendicular sides certainly works effectively as a low frequency horn terminus.

The disclosed invention has a footprint that uses 25 inches from the apex of the corner to the outside edge of the front panel, including the exclusive use of ¾ inch thick panels, which is considerably less protrusion into the listening space than the previously cited prior art examples of bifurcated horns. In addition, in the case of the front-loaded embodiments, furniture may be placed directly against or alongside the current invention as desired without degrading low frequency performance.

The preferred front-loaded embodiment uses full-channel hard surface reflectors to aid in maintaining phase relationships of the given waveform. It is intended to provide the least tortuous horn pathway possible for the waveform to travel within the limitations imposed by footprint size constraints.

In that there are no specific limitations or requirements of room size imposed by the design of the current invention, other than having a minimum of 7 foot ceilings, it is conceivable that the current invention is likely a better acoustic match to most domestic environments than side-exhausting horns as described previously.

The present invention is intended as an alternative to the bifurcated side-exhausting corner horn examples referenced previously, arising from a smaller footprint size and the virtue of not imposing any limitations on room size or dimensions, obstructions or elements, such as chimney intrusions, doorways, windows, and allowing for on-wall or near-wall objects, such as furniture, cornices, carpets or rugs, and the like.

DESCRIPTION OF THE INVENTION

Figure 1:
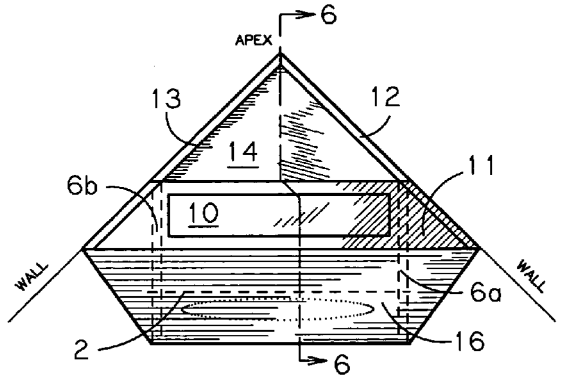
FIG. 1 is a top elevation view of the preferred front-loaded embodiment of the invention showing corner placement.
Figure 4:
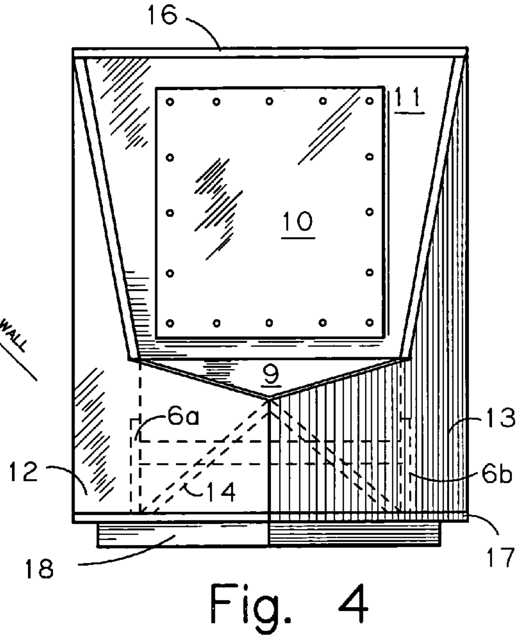
FIG. 4 is a rear elevation view of the preferred front-loaded embodiment showing the terminal horn channel.
Figure 2:
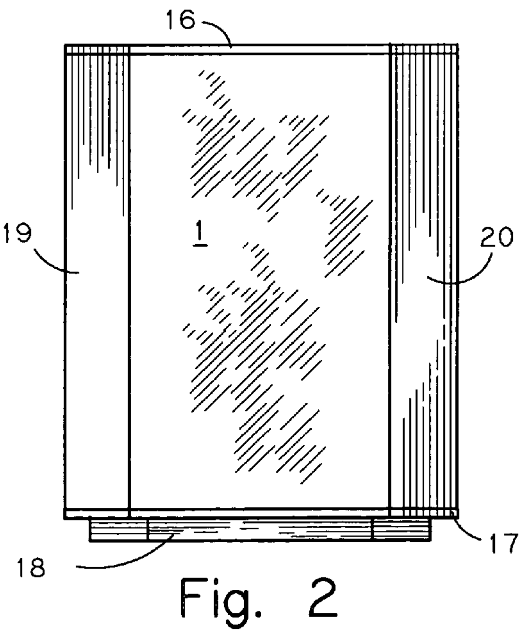
FIG. 2 is a front elevation view of the preferred front-loaded embodiment.
Figure 5:
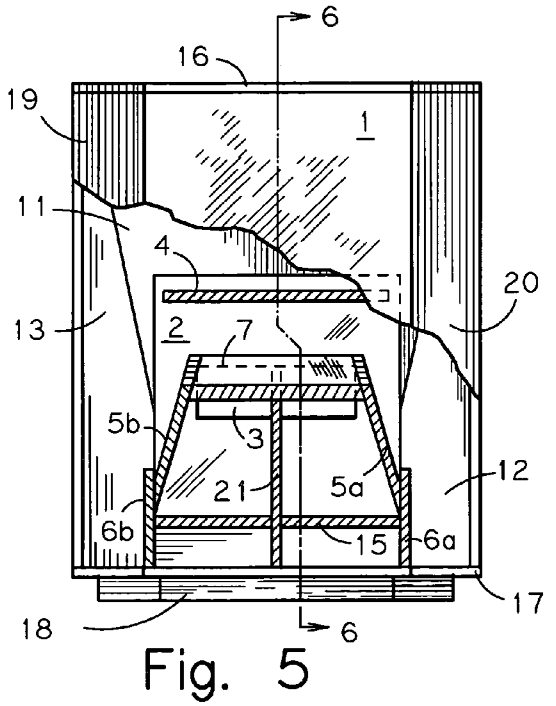
FIG. 5 is a cutaway view of the front of the preferred front-loaded embodiment showing the initial throat channels.
Figure 6:
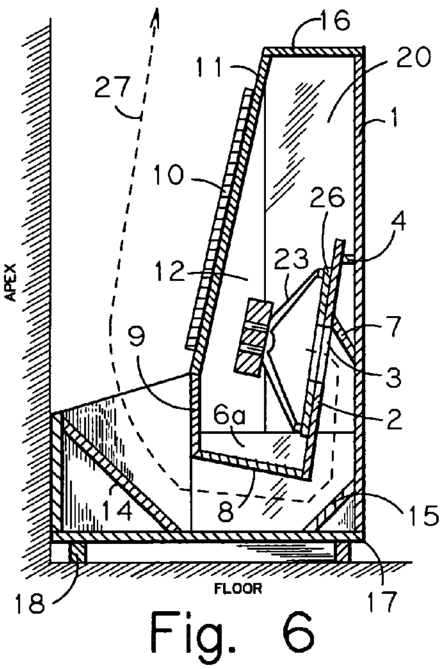
FIG. 6 is a sectional view of the preferred front-loaded embodiment from line 6-6 of FIGS. 1 and 5 showing the horn pathway.
Figure 7:
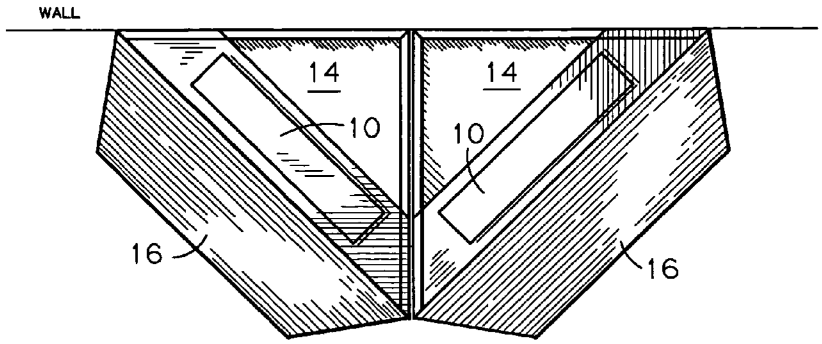
FIG. 7 is a top elevation view of a pair of the preferred front-loaded embodiments located side-by-side for operation in ¼ space.
Figure 8:
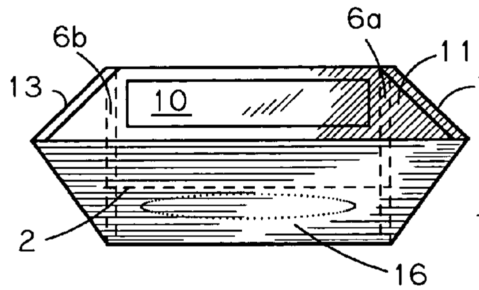
FIG. 8 is a top elevation view of the alternative front-loaded embodiment.
Figure 9:
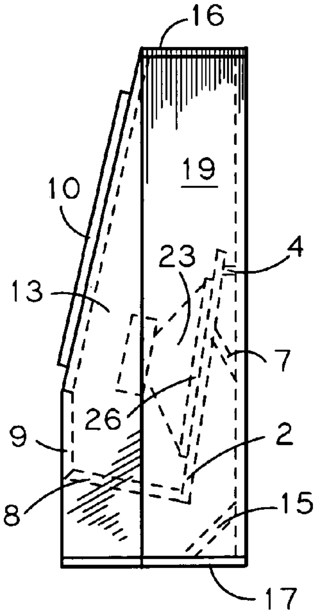
FIG. 9 is a side elevation view of the alternative front-loaded embodiment.
Figure 10:
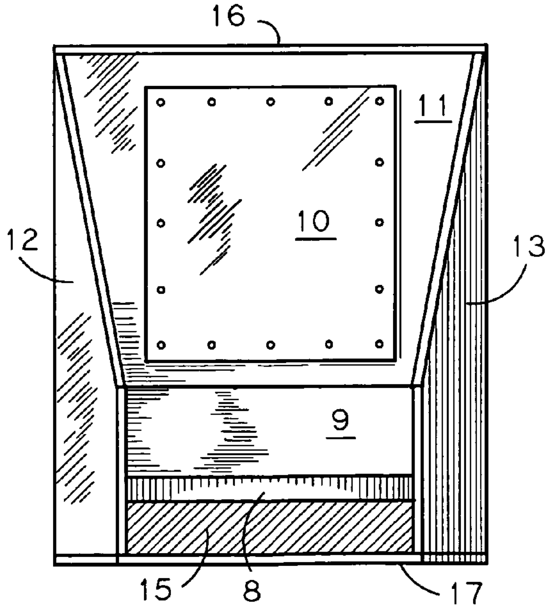
FIG. 10 is a rear elevation view of the alternative front-loaded embodiment.

As seen in FIGS. 1 through 7, the preferred front-loaded embodiment of the current invention employs a single 15 inch diameter driver 23, as best seen in FIG. 6, as does the alternative front-loaded configuration seen in FIGS. 8, 9, and 10. The overall enclosure height, sans riser 18, is 38 inches, determined to present the optimum height for the effective propagation of mounted midrange and/or high frequency horns to a seated audience. Since the invention employs an indirect horn mouth, that is, it does not exhaust directly at the audience, the minimum throat size required for achieving maximum efficiency was chosen as being paramount, in lieu of exploiting an upper-bass band pass capability with reduced efficiency. The throat size of the horn was selected as a best match for the reduced footprint size requirement and the desired low frequency performance and related cost of a particular driver. The current invention is disclosed as being constructed of ¾ inch wood panels.

Exponential expansion rates are used exclusively. In the preferred front-loaded embodiment, the initial throat expansion rate is 40 Hz, followed by an intermediate flare rate of 30 Hz and the terminal exit channel being 35 Hz. The front-loaded horn pathway is best seen in FIGS. 5 and 6. In other embodiments, as shown in FIGS. 12, 13, 14, and 15, the terminal pathway (or exit channel) may be the only horn channel boundaries employed. The terminal pathway is completed when the enclosure is placed in a corner. It may be seen that shorter horn pathways may be configured as in the alternative rear-loaded embodiments.

In the present disclosure, the theoretical result for an annulled back chamber volume (Vb) based on a specific driver is approx. 3919 cubic inches. The actual size of the current invention Vb is approximately 4000 cubic inches, including the displacement of the removable driver mounting board 26 (also called a motor board) and the low frequency driver 23 as best seen in FIGS. 6 and 9. The throat size and the back chamber volume is consistent for a variety of available drivers, allowing some choice of drivers to be made rather than being restricted to a single particular driver.

Referring to FIG. 5, the horizontal horn throat opening 3 in the slanted baffle board 2 is partially reflected via the throat reflector 7, which is intended to turn the waveform downward slightly less than 90 degrees into the vertical exponential channel formed by parts 1, 2, 5*a*, 5*b*, 6*a*, 6*b* and central brace 21 with the least turbulence possible. The horizontal brace 4 is used to suppress vibration of the angled throat baffle 2 and, along with the throat baffles and the central vertical brace 21, suppresses vibration in the front panel and provides structural attachment points.

Again referring to FIG. 5, the front exponential baffles 5*a*, 5*b* and front panel 1 are arranged in such a manner that acting in concert with the angled baffle 2, the angle of which is best seen in FIG. 6, the proper cross-sectional area for the expansion rate is maintained for 40 Hz or an exponential doubling length of 18 inches. The horizontal hard-surface reflector 15 at the bottom of the throat channel section is intended to reflect the waveform with the least amount of phase interference into the horizontal bottom channel, which is comprised of side channel parts 6*a*, 6*b* (FIGS. 5 and 6), upper channel part 8 (FIG. 6), and the bottom panel 17, which incorporates a 30 Hz flare rate or an exponential doubling length of 24 inches. The horizontal reflector 15 is considered useful in the front-loaded embodiments, however it is rendered entirely optional in the alternative embodiments due to the difference in upper frequency band pass requirements typical of the front-loaded and back-loaded embodiments. The triangular reflector 14, shown in FIGS. 1, 4, 6, and 7 at the rear of the horizontal channel is intended to turn the waveform 90 degrees with the least phase distortion possible. The channel changes at that point from being rectangular in cross-section to triangular. The terminal exit channel, being triangular in cross-section, utilizes a flare rate of 35 Hz or an exponential doubling length of 22 inches. The vertical front-to-rear side channel panels 6*a*, 6*b* seen in FIGS. 1, 4, 5 and 8 are not shown for reasons of clarity in FIGS. 9, 10, and 15, but form the sides of the bottom horn section and separate the interior horn channel from the back chamber. The application of side channel parts 6*a*, 6*b* will be quickly recognized by those skilled in the art and, for reasons of clarity, are intentionally omitted from certain drawings. It should be assumed that the two side channel parts 6*a*, 6*b* would be present in the embodiments which employ an interior horn channel, specifically FIGS. 6, 9, and 15.

Figure 3:
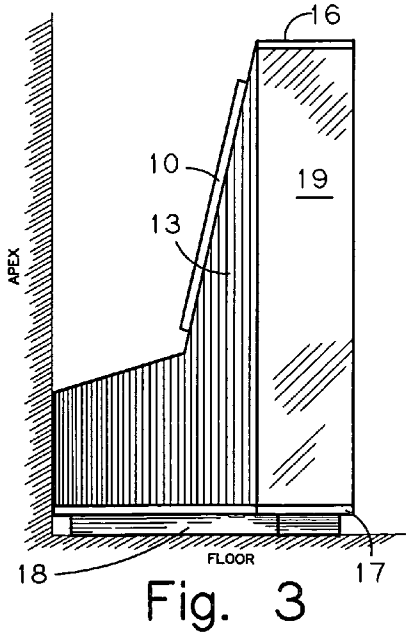
FIG. 3 is a side elevation view of the preferred front-loaded embodiment showing the orientation of the invention when placed in a corner.

The proximate vertical walls of the environment corner, acting in concert with the angled back panel 11 of the invention, form the terminal or exit channel boundaries, which are continued by the dihedral angle formed by the walls beyond the confines of the horn cabinet. In the preferred embodiment, as seen in FIGS. 3 and 4, the right-angle outer sidewalls 12, 13 of the current invention are appropriately cut down to reduce weight. The exit channel dihedron formed by the two right-angle corner walls will continue to propagate the waveform vertically until it is reflected back by the environment ceiling. The position of the invention within the environment corner assumes the right-angle sides 12, 13 of the invention are either physically touching the side walls of the corner or are proximate enough to form an effective seal which completes the horn exit channel and provides maximum waveform propagation. This characteristic feature provides an economy of weight, as well as imparts a distinctive form and appearance to the invention. Since the exit channel formed by the dihedron is open on one side, the waveform is expected to diffract in the direction of the unbounded side across the top panel 16, effecting the reflection from the ceiling plane to be "bent" to some degree towards the unbounded side, in part preventing a complete 180 degree reflection, and allowing a natural reflected path towards the unbounded side from the corner apex. This effect may aid in the propagation of mid-and-upper bass frequencies.

Due to the horn mouth occurring beyond the confines of the invention cabinet, it is difficult to accurately determine size and nature of the mouth, beyond a minimum pathway length of travel required to effect an optimum mouth size for achieving 35 Hz by geometric extension of the forward-expanding angle effected by the enclosure back panel 11. It is conceivable that the waveform will, in substantial part, travel the path length to the ceiling limit without completely unloading. It is expected that the waveform being propagated will tend to diffract towards unbounded space the further it travels. These elements increase the possibility of enhanced low frequency performance when compared to the previously cited side-exhausting prior art examples which certainly allow the simultaneous diffraction of the propagated waveform in more than one direction. Therefore, the boundary nature of the 2 dihedral surfaces tends to elongate the effect when compared to boundaries on only 2 of 4 sides, as in the prior art examples of side-exhausting horns. Comparatively, the effect is more pronounced as the upwardly propagated waveform is maintained in a more restrictive boundary state for a longer period, effectively providing an extended horn length.

Since the nature of the external horn expansion is expectedly more relaxed than the entirely bounded sections within the current invention, it is assumed that the use of tighter (or slower) flare rates would be useful, since the terminal section of the enclosure is technically an intermediate section of horn when in operation, and a substantial part of the overall expansion occurs outside the enclosure. In the case of the previously referenced prior art side-exhausting horns, calculations indicate one exponential doubling length is assumed to occur after the waveform leaves the confines of the enclosure and the frequency response curves typical the prior art devices bear this assumption out. In the case of the current invention, two additional expansion doubling lengths are required externally to achieve an optimal horn mouth size for the given Fc of 35 Hz. Due to the unbounded portion of the wall boundaries, it can be assumed that the expansion rate will naturally relax somewhat and therefore become shorter. For instance, the shorter exponential doubling point of 40 Hz is 18 inches and the overall expansion to achieve the optimum mouth size for that is 36 inches of travel beyond the top of the invention. Longer travel due to higher ceilings may resolve to the lower Fc of 35 Hz. Whether the flare rate employed at the terminus of the current invention determines the overall low frequency response or the additional expansion occurring in the dihedral of the corner and altering the overall Fc upward in frequency depends on the degree of diffraction experienced, the losses incurred due to viscosity, and the travel length of the waveform propagating upward in the environment corner.

The design of the current invention allows for access to the low-frequency driver 23 to be made from the back of the enclosure by means of a cutout in rear panel 11, closed by a removable panel 10, which remains unseen in normal use. In the case of the rear-loaded alternative embodiments employing at least one direct radiator, as shown in FIGS. 12, 13, 14 and 15, the driver or drivers could optionally be mounted directly to the front panel 1 from the front, thereby negating the necessity of access panel 10 and a cutout in the angled rear panel 11.

The use of a riser assembly 18 sized to raise the current invention above any side wall moldings enables its use in most domestic environments. Particular applications may optionally include or exclude the riser assembly as desired.

As shown in FIG. 6, the unitary horn pathway of the preferred front-loaded embodiment is described by dotted line 27. Measured center-of-channel from the throat opening 3 in angled baffle board 2 to the top panel 16 of the enclosure, the bounded horn path length of the preferred front-loaded embodiment is approximately 61 inches. The preferred front-loaded embodiment theoretically provides adequate operational length to act as a full ⅓ wavelength horn at 35 Hz. The operational unitary path horn length is calculated as approximately 9 feet in a room with a 7 foot ceiling. The optimum mouth size (assuming linear propagation) would require ceilings of 8.5 feet as a minimum, giving an overall pathway length of 10.5 feet or approximately ⅓ of a wavelength of 35 Hz. The invention will operate successfully with ceilings as low as 7 feet.

FIG. 6 discloses the driver mounting board 26, which is desirable for the ease of mounting or replacing drivers due to the weight of some drivers and the somewhat awkward position of the angled throat baffle 2. The driver mounting board is therefore only applicable in the front-loaded embodiments where the angled baffle 2 is present.

FIG. 7 describes the preferred front-loaded embodiment used in a pair, side-by-side, as seen from the top, for placement in ¼ space as might be desirable in larger format spaces than the typical domestic space, such as churches, theatres, or halls, particularly when a corner is not available and a relatively high sound pressure level is desirable.

Figure 11:
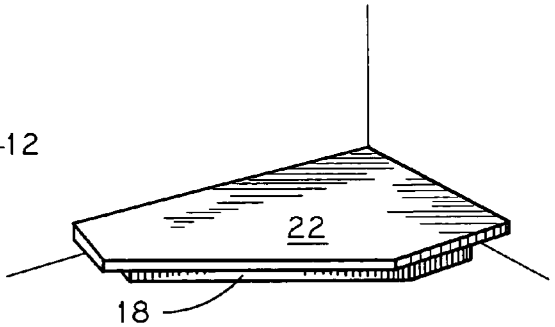
FIG. 11 is a perspective view of a riser assembly for alternative embodiments.

In the alternative front-loaded embodiment, as disclosed in FIGS. 8, 9 and 10, the alternative front-loaded configuration lacks the triangular reflector 14 and therefore the right-angle side walls 12, 13 used to mount it are shortened. This results in a more compact and lighter enclosure but with an expected decrease in upper band pass capability. Due to the tendency of a right-angle corner to reflect directly back to the sound source, the inclusion of the upward triangular reflector 14 may be desirable as a means to lessen the effect. However, there are ample prior art examples that do not take structural measures to avoid the resulting reflections from the corner. Presumably, the turbulence imposed on the waveform being propagated, in such an instance, would serve to attenuate the higher bass frequencies by cancellation. This frequency-limiting effect may be desirable and purposefully exploited, particularly in the case of the rear-loaded embodiments. FIG. 9 shows the alternative front-loaded version from the side and FIG. 10 discloses the alternative front-loaded version as viewed from the rear of the invention. For room applications where floor moldings may constitute an obstruction to achieving an effective seal of the lightened enclosure to the corner, FIG. 11 describes a separate stand assembly, comprised of the riser assembly 18 and a full corner panel 22, which can optionally be used to raise the enclosure above any floor molding obstruction typical of domestic dwellings while providing an effective seal to the environment corner walls. Additionally, the separate stand assembly allows for the triangular reflector 14 to also be employed as desired. The low-frequency response of the invention is relieved of using floor-boundary reflections enabling any desired riser height to be used.

Figure 12:
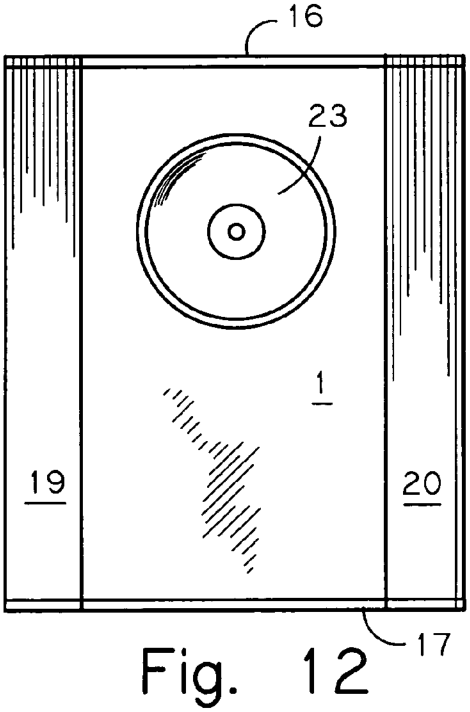
FIG. 12 is a front elevation view of the rear-loaded alternative embodiment.
Figure 15:
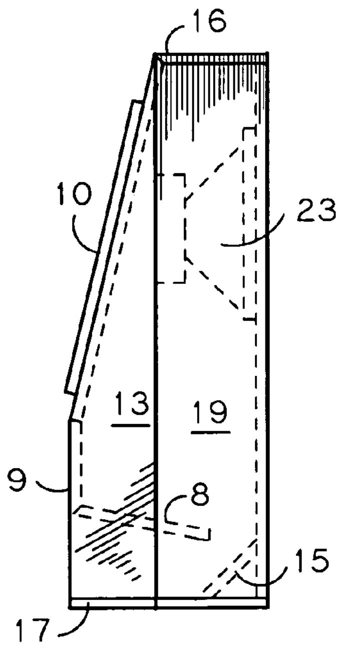
FIG. 15 is a side elevation view of the rear-loaded alternative embodiment.

FIG. 12 discloses the rear-loaded alternative embodiment as viewed from the front of the enclosure. FIG. 15 shows the rear-loaded alternative embodiment from the side. The overall enclosure size is the same as the preferred front-loaded embodiment and the driver 23 is also 15 inches in diameter, however, ample room is available on the front panel to support up to two 15-inch drivers or a single 18-inch driver. The front-loaded throat assembly pieces as seen in FIGS. 5 and 6 are optional in the case of the rear-loaded embodiment; however, the rear-loaded version could simply be achieved by mounting the driver in the front panel 1, as seen in FIGS. 12 and 15. While the invention contemplates the ability to operate as either a front or back-loaded horn, it is natural that the internal channel components be reduced in number as the requirements of rear-loaded operation are less stringent, especially in the case of achieving a wide bandwidth or maximum efficiency, and the available back chamber volume would subsequently increase. It should be understood that any of the alternative configuration embodiments could optionally be constructed to employ the upward triangular reflector as seen in the preferred front-loaded embodiment, with extended side panels to support it, in addition to the optional incorporation of an attached riser. The rear-loaded embodiments are expected to be more economical due to the fewer number of parts compared to the front-loaded embodiments.

An additional benefit of the invention concerns the diffraction-limiting effect of the angled front corners of the enclosure formed by parts 19, 20 when used in a rear-loaded configuration.

Figure 13:
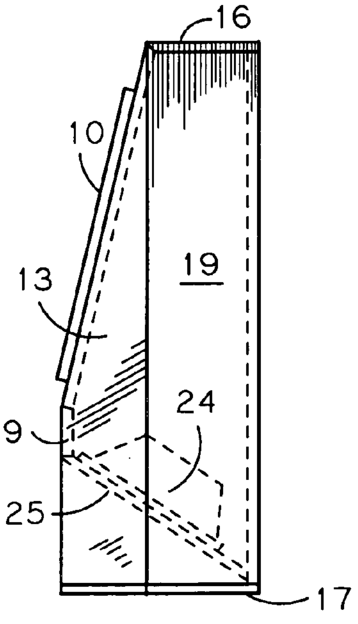
FIG. 13 is a side elevation view of another alternative embodiment.

FIG. 13 discloses the side view of another embodiment, which can be configured as a front-loaded or rear-loaded horn, again using the same overall cabinet size as the preferred embodiment. Utilizing a baffle 25 specific to the application, the driver 24 is horn loaded by a short expanding throat section formed by the arrangement of baffle 25 and the bottom panel 17. The alternative driver 24 could also consist of a passive radiator, a simple open reflex port, or a combination. In the case of the front-loaded configuration with a baffle, as seen in FIG. 13, the driver or passive radiator employed would likely be 12 inches in diameter or smaller.

Figure 14:
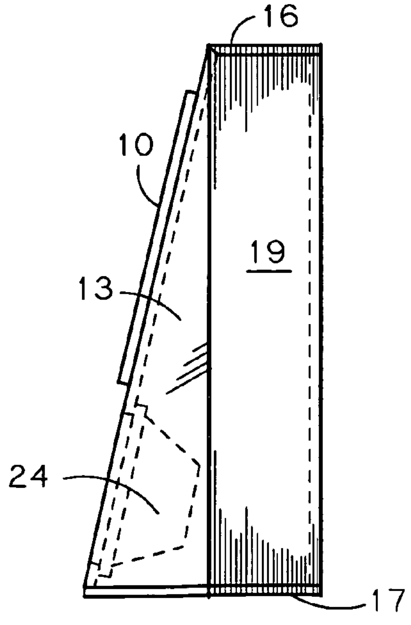
FIG. 14 is a side elevation view of another alternative embodiment.

FIG. 14 discloses another alternative configuration featuring the exposure of the diaphragm directly into the enclosure terminal exit channel for either a passive radiator or an active driver 24, allowing operation as either a front or rear-loaded horn. The active driver in the former case would presumably, but not necessarily, be located on the front panel for direct radiating use as seen in FIGS. 12 and 15. The area available in the configuration shown in FIG. 14 for the driver would limit it to a relatively small diameter, and 10 inch diameter subwoofer drivers with relatively large excursions such as found in automotive audio installations may be therefore be warranted.

The various embodiments may optionally employ different Vb requirements based on the driver or drivers employed, particularly in the case of the rear-loaded alternative embodiments, which can be achieved by altering the frontal geometry of the enclosure by moving the front panel 1 closer or further away from the corner apex as desired. The front corner panels 19, 20 would also be adjusted in size and position (or left out entirely) to compensate, along with the effected portions of the top 16 and bottom 17 panels, thereby altering the internal volume accordingly. It can be anticipated that right-angle corners could also be employed instead of the angled front corners described in the drawings. The enclosure height could also be changed from that seen in the present disclosure to achieve certain performance goals.

It will be understood by those experienced in the art that the overall Fc of the terminal horn dictates the size of the enclosure; therefore, the cabinets shown may be made larger or smaller than the preferred embodiment depending on the target Fc of the alternative application, and alternative drivers may be substituted to suit a particular need.

It should also be realized that the alternative-use configurations, especially in the rear-loaded direct radiator embodiments, the front panel 1 could easily accept multiple drivers as could the access panel 10, or rear panel 11 (without the access cutout). The possible alternative configurations are therefore many and should not be limited to only that which is defined in the drawings.

Whereas this disclosure depicts one specific type of manufacture, it should not be limited to materials and processes that utilize only straight planar elements, such as plywood and the like. It should also be noted that while straight lines have been used for describing the various horn channels and reflectors, an alternative and perhaps better embodiment could utilize curved or concave elements which would promote an even rotational angle or approximate a true exponential curve more closely.

While in accordance with the provisions of the Patent Statutes, the preferred forms and embodiments have been illustrated and described, it will become apparent to those skilled in the art that various changes and modifications may be made without deviating from the inventive concepts set forth above.

I claim:

1. In a horn loudspeaker adapted to be operated in a corner formed by three mutually perpendicular surfaces, an enclosure comprising:

a plurality of baffles in relation to form a substantially vertical air chamber, said air chamber being sufficiently wide and adapted to cooperate in sealed relation with the vertical said perpendicular surfaces of said corner thereby defining a barrier to the passage of sound waves between the side walls of said air chamber and said vertical perpendicular surfaces and between the horizontal perpendicular surface of said corner and the bottom of said air chamber, said air chamber positioned where the intersection of said vertical perpendicular surfaces is most rearward, at least one aperture in one of said baffles, each said aperture being closed by a cooperating sound source, a second plurality of baffles, internally arranged in said air chamber, defining an expanding air column which expands primarily vertically from the lower frontward portion of said air chamber and which exits rearwardly at the bottom of said air chamber, and said air chamber further including an exterior baffle, arranged rearwardly and above said exit, spaced forward of said intersection and angled to slope in a forward direction, thereby completing said air chamber and partially defining a further length of an upward expanding air column, the definition of said further column being completed by said vertical perpendicular surfaces.

2. In a horn loudspeaker as set forth in claim 1, wherein said sound source consists of at least one electro-acoustic transducer.

3. In a horn loudspeaker as set forth in claim 1, wherein said plurality of baffles includes two vertical side baffles adapted with corresponding forward-angled edges providing an ungular plane, engaged in sealed relation with said exterior baffle, defining the flare rate of said further column, and arranged to form a basal right angle to cooperate in sealed relation with said vertical perpendicular surfaces.

4. In a horn loudspeaker as set forth in claim 1, wherein said further column is oriented along the axis of the dihedron formed by said intersection.

5. A horn loudspeaker adapted for corner operation comprising:

a bottom panel of substantially triangular shape, truncated to form facets at the front corners, said bottom panel being sufficiently wide at the rearmost narrow portion thereof and at the forwardly widest portion thereof to cooperate in sealed relation with the corner walls, two side wall panels, vertically arranged, with the sides forming a right angle to cooperate in sealed relation with said corner walls, engaged in sealed relation with said bottom panel, and adapted to form a forward sloping contour on the rearward edges, two front corner panels, vertically arranged, diverging rearwardly, engaged in sealed relation with said bottom panel facets and said side panels, a front panel, vertically arranged, engaged in sealed relation with said front corner panels and said bottom panel, a rear panel, spaced forward of the intersection of said corner walls, engaged in sealed relation with said side panels along said forward sloping contour defining the single exponentially expanding boundary of an upward flaring air column therewith, said upward flaring air column expanding exclusively in a forwardly direction, with said rear panel and said side wall panels cooperating in sealed relation with said corner walls, the throat opening of said flaring column being located below said rear panel, a top panel, engaged in sealed relation with said side, front corner, and front panels, thereby completing an air chamber and partially defining the mouth of said flaring column, said air chamber being outwardly adapted and arranged to provide forwardly of said upward flaring column an acoustically sealed vertical relation to said corner walls thereby substantially preventing the horizontal passage of sound waves between said air chamber and said corner walls when said air chamber is placed in said corner, said corner walls thereby completing said mouth, a sound source, and means for transmitting sound into said throat.

6. A horn loudspeaker as set forth in claim 5, wherein said sound source consists of at least one sound transducer.

7. A horn loudspeaker as set forth in claim 6, wherein said means includes a plurality of baffles in sealed engagement, arranged internally in said air chamber and rearwardly of said front panel, cooperating with said sound transducer being mounted to a vertically arranged apertured baffle cooperating in sealed relation with said front panel and angled to diverge from said front panel at the bottom, thereby completing a downward flaring air column from said aperture.

8. A horn loudspeaker as set forth in claim 7, wherein said means further includes internal baffles enclosed within said air chamber arranged in sealed engagement, cooperating with said panels to further define said back chamber for said transducer, and partially defining a preceding section of air column of contracting cross-section from said throat opening to said downward flaring column, the definition of said preceding section being completed by said bottom panel.

9. A horn loudspeaker as set forth in claim 5, wherein said upward flaring column is further defined by said corner walls, thereby said mouth and said flaring column being substantially triangular in cross-section.

10. A horn loudspeaker as set forth in claim 6, wherein said sound source is mounted in said front panel.

11. A horn loudspeaker as set forth in claim 10, wherein said means includes baffles arranged in sealed engagement, cooperating with said panels to form a back chamber for said transducer, thereby defining a preceding section of air column of contracting cross-section from said throat opening to said back chamber.

12. A horn loudspeaker as set forth in claim 6, wherein said means consists of baffles arranged in sealed engagement, with said sound transducer mounted on a rearwardly arranged apertured baffle in sealed engagement with said throat opening, cooperating therewith to transmit sound into said upward flaring column.

13. A horn loudspeaker as set forth in claim 6, wherein said means consists of baffles arranged in sealed engagement, with said sound transducer mounted on an apertured baffle, arranged at an appropriate angle to form a short preceding section of an expanding air column cooperating with said bottom panel, transmitting sound into said throat opening therewith.

* * * * *